US012323175B2

(12) United States Patent
Dawson et al.

(10) Patent No.: US 12,323,175 B2
(45) Date of Patent: Jun. 3, 2025

(54) CELLULAR NETWORK THAT DYNAMICALLY ADJUSTS BANDWIDTH AND NUMBER OF MIMO PATHS BASED ON REALIZED CHANNEL CAPACITY

(71) Applicant: TalkingHeads Wireless, Inc., Roslindale, MA (US)

(72) Inventors: Joel L. Dawson, Roslindale, MA (US); Mark A. Briffa, Tyreso (SE)

(73) Assignee: TalkingHeads Wireless, Inc., Roslindale, MA (US)

( * ) Notice: Subject to any disclaimer, the term of this patent is extended or adjusted under 35 U.S.C. 154(b) by 548 days.

(21) Appl. No.: 17/592,688

(22) Filed: Feb. 4, 2022

(65) Prior Publication Data
US 2022/0158672 A1 May 19, 2022

Related U.S. Application Data

(63) Continuation-in-part of application No. 17/525,392, filed on Nov. 12, 2021, now Pat. No. 11,990,926.

(60) Provisional application No. 63/112,534, filed on Nov. 11, 2020, provisional application No. 63/112,515, filed on Nov. 11, 2020, provisional application No. 63/112,526, filed on Nov. 11, 2020, provisional application No. 63/112,542, filed on Nov. 11, 2020.

(51) Int. Cl.
| | |
|---|---|
| *H04B 1/04* | (2006.01) |
| *H03F 3/24* | (2006.01) |
| *H04B 1/12* | (2006.01) |
| *H04W 52/24* | (2009.01) |

(52) U.S. Cl.
CPC ........... *H04B 1/0483* (2013.01); *H03F 3/245* (2013.01); *H03F 2200/451* (2013.01); *H04B 2001/045* (2013.01)

(58) Field of Classification Search
None
See application file for complete search history.

(56) References Cited

U.S. PATENT DOCUMENTS

| | | | |
|---|---|---|---|
| 9,769,684 B1 * | 9/2017 | Fiumano | H04W 24/06 |
| 9,942,858 B1 * | 4/2018 | Merlin | H04W 52/283 |
| 10,003,374 B1 * | 6/2018 | Lee | H03F 3/245 |
| 10,608,852 B2 * | 3/2020 | Wang | H04B 1/0483 |
| 11,342,885 B2 * | 5/2022 | Elgani | H03F 3/1935 |
| 11,990,926 B2 * | 5/2024 | Briffa | H03F 1/52 |
| 2010/0248660 A1 * | 9/2010 | Bavisi | H04B 1/0458 |
| | | | 455/120 |
| 2016/0315719 A1 * | 10/2016 | Jian | H04B 17/13 |
| 2018/0062606 A1 * | 3/2018 | Lim | H04B 1/0458 |
| 2019/0334755 A1 * | 10/2019 | Limberg | H04L 27/28 |

* cited by examiner

*Primary Examiner* — Pablo N Tran
(74) *Attorney, Agent, or Firm* — Daly, Crowley, Mofford & Durkee, LLP

(57) ABSTRACT

Described are concepts, systems and techniques for dividing a communication channel such that no single radio frequency (RF) power amplifier (PA) in a remote radio head (RRH) operates over an excessively wide frequency bandwidth. This allows efficient operation of the RF PA wherein each PA transmit path is tuned for operation at a respective one of a plurality of different center frequencies ($f_o$, $f_o+\Delta f$, ... $f_o+(n-1)\Delta f$ where n is an integer corresponding to the number of RF PA transmit paths.

14 Claims, 8 Drawing Sheets

US 12,323,175 B2

CELLULAR NETWORK THAT DYNAMICALLY ADJUSTS BANDWIDTH AND NUMBER OF MIMO PATHS BASED ON REALIZED CHANNEL CAPACITY

BACKGROUND

As is known in the art, many modern wireless systems commonly utilize so-called distributed base stations (also sometimes referred to as a baseband unit) which comprise a base station and one or more remote radio heads (RRHs). In such distributed base stations the radio equipment contained in the RRH which is remote from a base station. An RRH may contain, for example, the base station's RF circuitry plus analog-to-digital/digital-to-analog converters and up/down converters. RRHs also have operation and management processing capabilities and an interface to couple to the remaining portions of the base station.

As is also known, RRHs often utilize multiple antennas (e.g. multiple-input multiple output or MIMO antenna systems. The use of MIMO antenna systems in RRHs is done for a variety of reasons such as to provide protection against signal fading and to allow use of beamforming techniques which may improve performance characteristics of a wireless system.

SUMMARY

In accordance with the concepts, systems and techniques disclosed herein, described is an additional use of multiple antennas, namely: divide a communication channel so that no single RF power amplifier in an RRH has to carry so much bandwidth that it cannot be efficiently operated (e.g. biased in a way that the PA efficiency is relatively high compared with a maximum efficiency achievable with the PA.

In theory, the channel capacity scales linearly with the number of MIMO paths. In practice, channel capacity grows much slower (~square root).

In accordance with the concepts, systems and techniques described herein, it has been recognized that frequency bandwidth is always important/critical for high-capacity networks. However, it is also recognized that high bandwidth in RF systems leads to low efficiencies. This results in RRHs that are large, heavy, and expensive to operate.

To address these issues, described are concepts, systems and techniques which allow for high frequency bandwidth and high capacity RRHs that are also small, light and relatively inexpensive compared with conventional RRHs.

This result is achieved by tuning each power amplifier (PA) path for different center frequencies, to allow for coverage of wide aggregate frequency bandwidths in a variety of deployed frequency bands (keeping in mind that channel capacity always goes linearly with bandwidth when the SNR is substantially above 0 dB). In embodiments, the bandwidth of each path is chosen to allow high efficiency operation of a PA in the RRH. When few frequency bands are deployed, there is the option to raise amplifier supply voltages (e.g. Vdds) to keep total output power high. It should be noted that in this context, "few" means that PAs tuned to certain center frequencies are turned off because the bands that they are centered for are not being used (e.g., PAs in one or more of paths of an RRH employing a MIMO antenna).

When many bands are deployed, PA bias voltages (e.g. PA supply voltages or Vdds) can be adjusted (e.g. lowered) to keep total output power constant. It should be noted that in this context "many" means all or almost all of the PA paths.

In embodiments, MIMO rank is increased by adding more paths at a given frequency offset.

Some feedback mechanisms which can be used in accordance with the concepts, systems and techniques described herein include, but are not limited to: (1) real-time measurements of achieved bit rate, and effective MIMO rank (this leads to a maximally adaptable cellular network); and long-term network statistics. In embodiments, either type of feedback (or even multiple types of feedback) may be used (either individually or in combination).

Some benefits of these concepts, systems and techniques include, but are not limited to an increase in the overall efficiency and lower the energy consumption of the RRH over its lifetime. The results in lower operating costs.

Other feedback mechanisms which can be used in accordance with the concepts, systems and techniques described herein include, but are not limited to: (1) real-time measurements of SNR, and/or monitoring the dynamic coding decisions made in the network that determine the peak-to-average power ratio (PAPR) for each RRH pipe; and/or long-term network statistics. Either feedback mechanism may be used or these feedback mechanisms may be used in combination.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1:
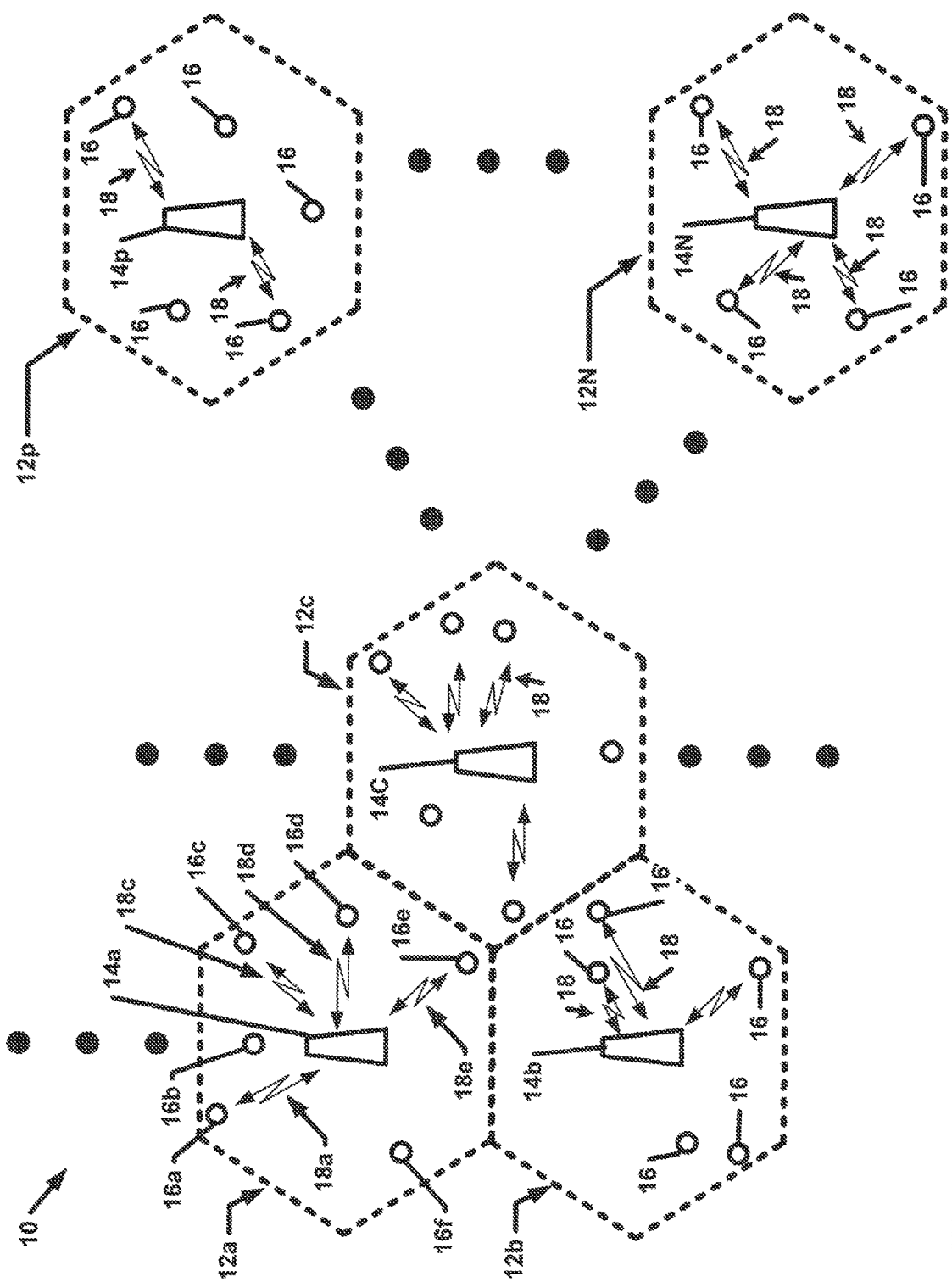
FIG. 1 is a block diagram of a cellular network having multiple cells.

Referring now to FIG. 1, a cellular network 10 comprises a plurality of cells 12a-12N. In this illustrative embodiment, cellular network 10 is illustrated as a Global System for Mobile (GSM) cellular network in which base stations are deployed to establish cells having substantially uniform hexagonal shapes. In this illustrative embodiment, cells 12a-12N comprise at least one distributed base station 14a-14N As used herein, the phrase "distributed base station" comprises a baseband unit and one or more remote radio heads (RRHs). The RRH's are typically coupled to a cell tower as is generally known. Such RRHs may be located substantially at or near the center of each cell and be coupled to one or more antennas. In embodiments, the one or more antennas may be integrated with RRH circuitry to provide an integrated antenna/RRH. Thus, a so-called integrated RRH may comprise RRH circuitry and one or more antennas. The one or more distributed base stations may be the same as or similar to the distributed base stations to be described below in conjunction with FIGS. 2A-3.

Taking cell 12a as representative of cells 12b-12N, cell 12a comprises distributed base station 14a. Distributed base station 14a comprises a baseband unit coupled to one or more RRHs (which maybe integrated RRHs).

At certain points in time, one or more mobile units generally denoted 16 are positioned in various ones of cells 12a-12N. In the example of FIG. 1, mobile units 16a-16f may be positioned within cell 14a at certain points in time or for periods of time. While within cell 14a, one, some or all of the mobile units 16a-16f may establish a wireless communication link (or more simply, a link generally denoted 18) with distributed base station 14a. In the example of FIG. 1, mobile units 16a and 16c-16e establish corresponding links 18a and 18c-18e with distributed base station 34a (e.g., unit via an RRH) while mobile units 16b, 16f do not establish links with distributed base station 14a Each link 18a and 18c-18e has an associated signal to noise ratio (SNR), Based upon a measured signal-to-noise ratio (SNR) on any given link in a cell, the upper limit of channel capacity is known (Shannon limit). Also, based upon a selected coding strategy implemented within a network (e.g. convolution coding) and the measured SNR, the maximum realizable capacity for a channel may be determined. Furthermore, an actual achieved bit rate in a link may be measured and thus known.

The SNR required to achieve a certain bit rate in a link of network 10 can be determined from known performance metrics of a coding strategy used in the network. If a measured SNR exceeds this "required" SNR, the difference between the two may be considered an "excess" SNR. It has also been recognized that such excess SNR corresponds to an amount of base station transmitter power which is in excess of that base station transmitter power needed to produce an SNR which allows a link to achieve the certain bit rate. That is, it has been recognized that under certain conditions, it is possible to reduce an amount of base station transmit power while maintaining a same actual achieved bit rate of a link. In accordance with the concepts described herein, it has been recognized that from data collected in a network (e.g. including but not limited to SNR. data), one can determine how much excess SNR exists and thus how much excess transmit power exists.

Such information may be used to dynamically adjust transmit power of a base station or an RRH or design a base station or RRH which transmits signals at a power level which is below power levels transmitted by conventional RRHs and which ideally which is at or near a minimum amount of transmit power required to establish a desired bit rate (e.g. a bit rate which is substantially the same as an actual achieved bit rate of a link operating with a conventional RRH).

Thus, in response to a known actual bit rate achieved in the cellular network, the cellular network may be configured to dynamically scale a base station transmitted output power (e.g. as transmitted via an RRH) to an amount of transmitted output power which is substantially at or near a minimum amount of transmit power needed (ideally, at all times) to maintain an achieved bit rate. With this approach, the power consumption of a transmit system in an RRH may be reduced (or ideally minimized). In embodiments, by transmitting an output power which is substantially at or near a minimum amount of transmit power needed to maintain a known actual bit rate, power consumption of a transmit system can be reduced below the power consumption used in a conventional RRH/base station system. Furthermore, by transmitting signals at an output power level which is consistently (and ideally always or substantially always) at or near a minimum amount of transmit power levels needed to maintain the known actual bit rate (and ideally always maintain the known actual bit rate), the power consumption of an RRH transmit system may be reduced below that of a conventionally operating RRH (and ideally may be minimized).

In embodiments, the RF transmit signal path (and in particular the RF PA in an RRH transmit signal path), can be scaled (e.g. dynamically scaled) to maintain an efficiency which is higher than an efficiency achievable with existing conventional systems. In embodiments, a transmit signal path (of an RRH, for example) may comprise a transmit-receive (T/R) circuit.

Furthermore, in embodiments, by observing long-term statistics, it is possible to design a remote radio head (RRH) and/or active antennas to have a form factor (e.g., one or more of a size, shape, area and/or volume) which is smaller than a form factor of a conventional RRH. This is possible since, in accordance with the concepts described herein, it has been recognized that an RRH may be designed to satisfy/meet link or network characteristics (or needs) derived or otherwise measured or determined from observing long-term statistics of a link and/or network.

Figure 2A:
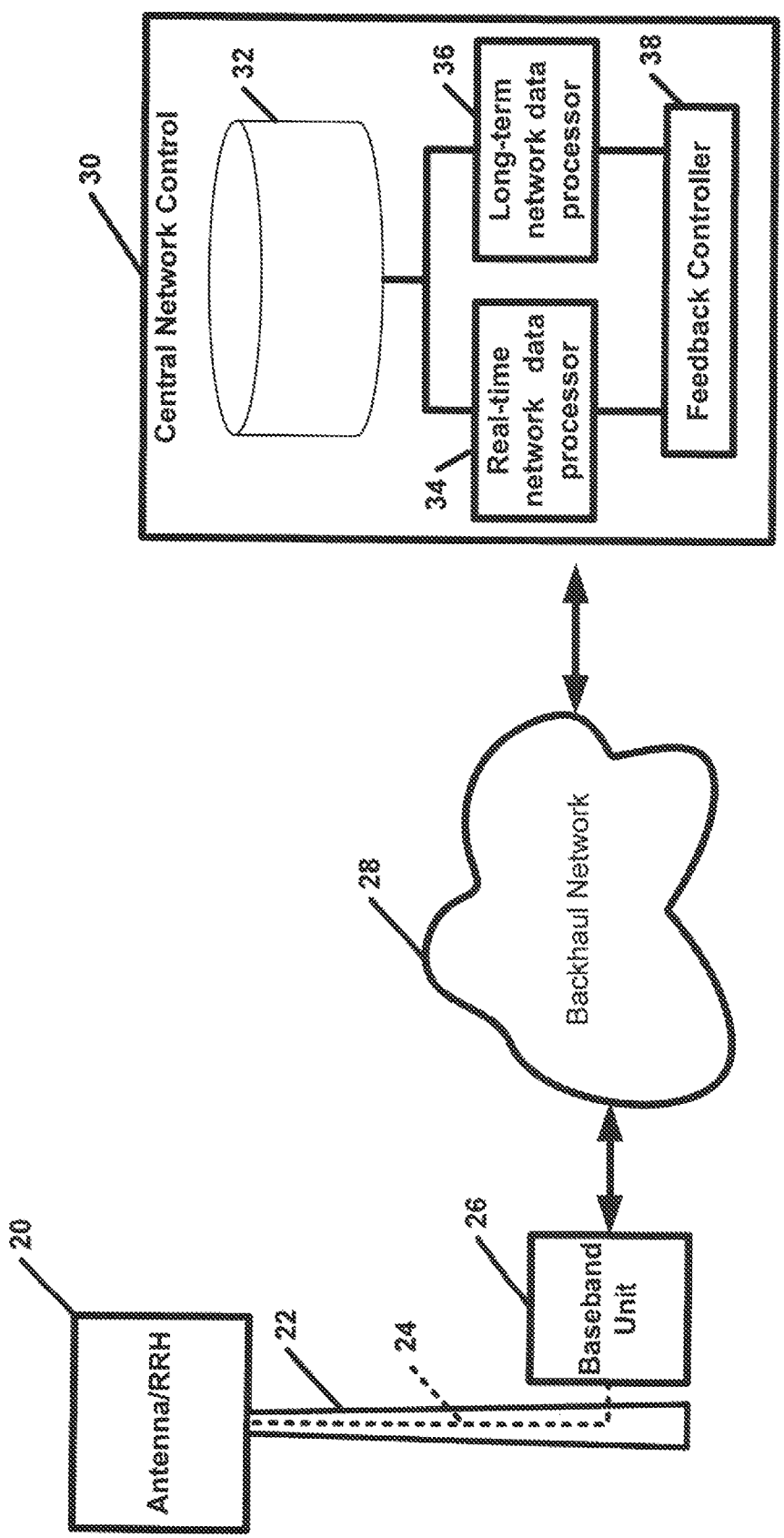
FIG. 2A is a block diagram of a single cell of a cellular network having a remote radio head (RRH) and baseband unit coupled to a central network control through a backhaul network.
Figure 2B:
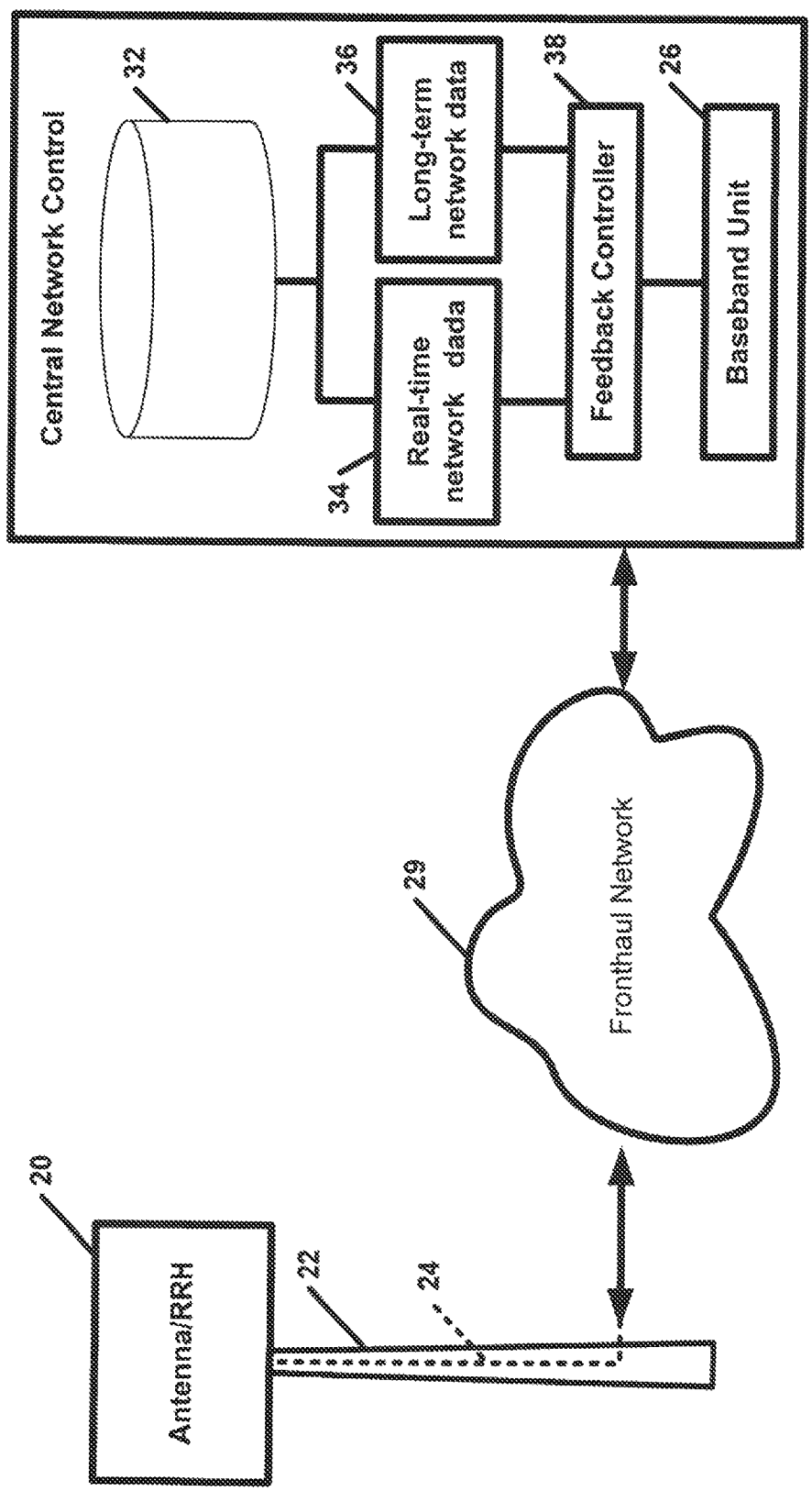
FIG. 2B is a block diagram of a single cell of a cellular network having an RRH coupled through a fronthaul network to a baseband unit located in a central network control.

Such measured, derived, or otherwise determined characteristics/needs may be determined from network-related information collected and stored in a database (e.g. such as database 32 in FIGS. 2A, 2B) and computed or otherwise determined by one or both of processors 34, 36 in FIGS. 2A, 2B). This design approach leads to smaller (i.e. physically smaller in area and/or volume), physically lighter RRHs. Designing networks, systems and components in accordance with the concepts described herein leads to an adaptable cellular network and ideally leads to a maximally adaptable cellular network comprising RRH's which are both smaller and highly efficient relative to conventional RRHs.

This design approach is in contrast to conventional approaches to RRH design in which an RRH is designed to always (or substantially always) satisfy/meet worst case link or network characteristics or scenarios.

In embodiments, a feedback mechanism may be used to measure or otherwise capture real-time measurements of SNR, bit rate, and/or achieved capacity. In embodiments, one feedback mechanism is feedback based upon long-term network statistics. In embodiments, multiple feedback mechanisms can be used. For example, in embodiments, real-time measurements of SNR and/or bit rate and/or achieved capacity and/or long-term network statistics can be used. In embodiments, the some or all of the above feedback mechanisms can be used alone or can be used in combination.

Referring now to FIG. 2A, an antenna and RRH 20 deployed or otherwise disposed on a cell tower are coupled to a baseband unit 26. RRH 20 may be coupled to baseband unit 26 using wireless techniques (e.g. microwave, millimeter wave (MMW), free space optics (FSO) links or using hard wire techniques (e.g., fiber optic cable).

In some embodiments, the antenna and RRH may be provided as separate components which are coupled together via a mechanical connection such as via a coaxial cable with a first end having an RF connector coupled to an antenna port and a second end having an RF connector coupled to an output port of an RRH transmit signal path comprising a PA to thus provide an RF signal path between an output of the PA and an input of the antenna. In other embodiments, the antenna and the RRH may be provided as an integrated unit (i.e. an integrated RRH/antenna unit) in which case a coaxial cable connection between the antenna and the RRH circuitry may not be required.

The baseband unit 26 is coupled through a network 28 (a so-called backhaul network) to a central network control 30 (e.g. a so-called central office). Network characteristics (including link and/or channel characteristics) which may be measured, collected or otherwise determined as well as information related or derived from network characteristics may be provided to one or more databases 32 (with a single database being illustrated in FIG. 2A) and/or one or more processors 34, 36 from the baseband unit 26. Such information may, for example, include but is not limited to measured SNR, the maximum realizable capacity for a channel. an actual achieved bit rate. Such information may be collected on individual links, on individual cells, or on the network as a whole.

Such information may be used dynamically scale a transmit signal path in an RRH such that the RRH operates at and maintains an efficiency which is higher than an efficiency achievable with prior art RRHs. In embodiments, a transmit signal path includes at least a PA (e.g. a PA provided as part of a transmit-receive (T/R) circuit).

Furthermore, in embodiments, by observing long-term statistics, it is possible to design an RRH and components of an RRH to have a form factor (e.g., one or more of a size, shape, area and/or volume) which is smaller than a form factor of a conventional RRH and/or components which make up a conventional RRH. In the case of an integrated RRH, the re-designed components may include one or more re-designed antennas (e.g. an active antennas). This is possible since, in accordance with the concepts described herein, the RRH may be designed to satisfy/meet characteristics (or needs) by taking into account long-term statistics of a network, rather than always preparing for the absolute worst case. Such derived characteristics/needs may be derived or determined from network-related information collected and stored in database 32 and computed or otherwise determined by one or both of a real-time data processors 34 and/or a long-term data processor 36. This design approach leads to RRHs which are smaller (i.e. physically smaller in area and/or volume), and physically lighter than conventional RRHs. It should appreciated that while processors 34, 36 are illustrated as separate processors in the example of FIG. 3, in embodiments a single processor may implement all functions performed by the two processors 34, 36. Similarly, although database 32 is illustrated as a single database, in embodiments, multiple separate databases may be used.

Referring now to FIG. 2B in which like elements of FIG. 2A are provided having like reference designations, in this embodiment a distributed base station comprises RRH 20 and base station 26 with base station 26 being located in the central network control 30 (e.g. a central office). Thus, in this embodiment, RRH 20 is coupled to baseband unit 26 through a network 29 (a so-called fronthaul network).

Figure 3:
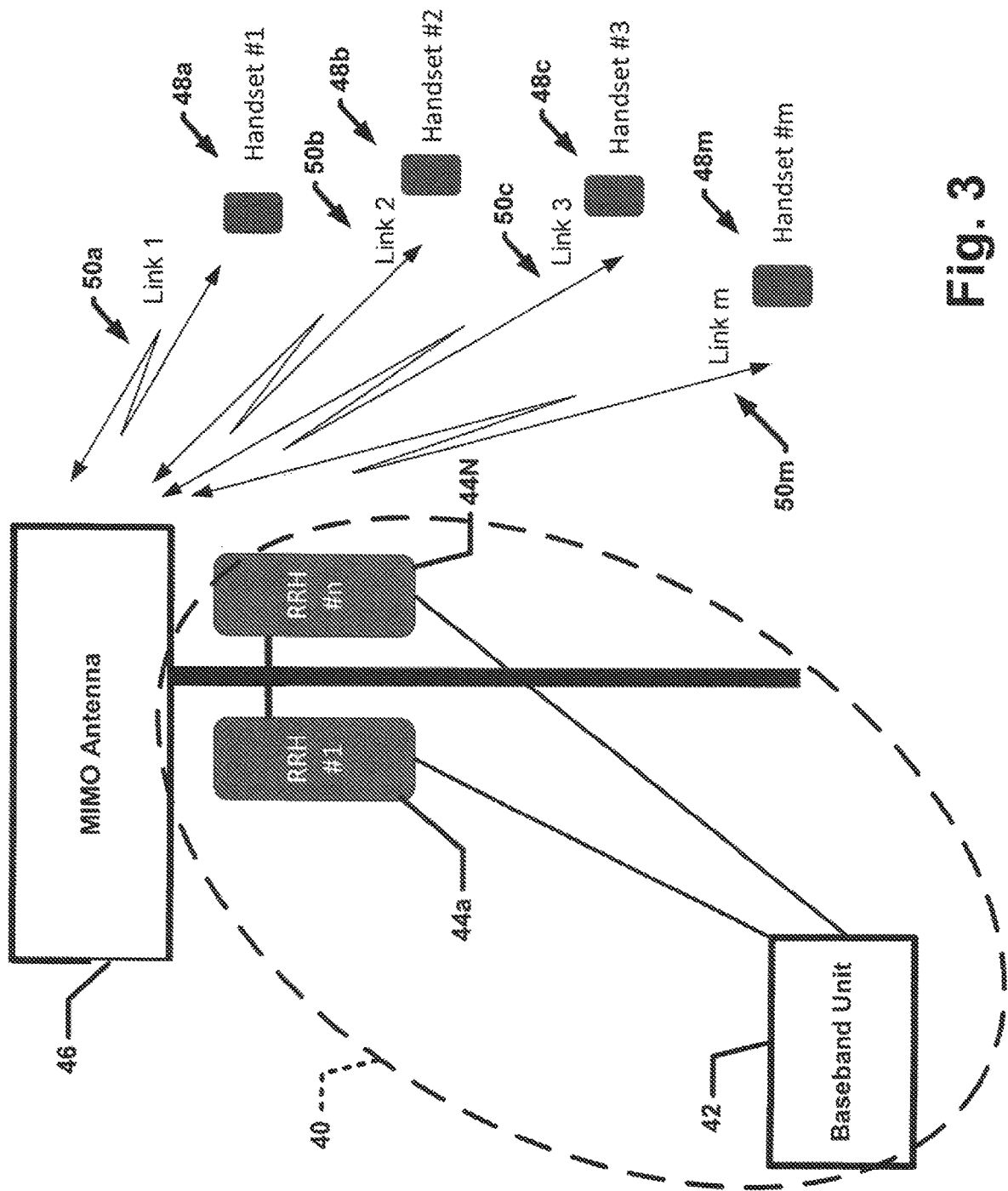
FIG. 3 is a block diagram of an example architecture of a single cell of a cellular network which may be the same as or similar to one of the cells in the example network of FIG. 1.

Referring now to FIG. 3, a portion of a cellular network comprises a distributed base station 40 have a baseband unit 42 communicatively coupled to one or more remote radio heads (RRHs) 44 (with two RRHs 14a, 14N being illustrated in FIG. 3).

As noted above, baseband unit 42 may be coupled to the RRHs 44a, 44N using wireless techniques (e.g. microwave, millimeter wave (MMW), free space optics (FSO) links or using hard wire techniques (e.g., fiber optic cable). RRHs may contain radio frequency (RF) circuitry in addition to analog-to-digital converters (ADCs) or digital-to-analog converters (DACs) and frequency translation circuits (e.g., up/down converters such as RF mixers). In particular RRHs 44 include a transmit signal path (sometimes referred to as an "RF line-up") which comprises one or more PAs which amplify RF signals provided thereto which are then emitted through the antenna.

RRH units 44 are coupled to one or more antennas 46. One or more mobile communication devices (with m such devices 48a-48m being shown in FIG. 1) coupled to the RRHs 44 through corresponding communications links 50a-50m. The mobile communication devices 48a-48m may correspond to handsets (e.g. smart phones, (including but not limited to iPhones, Android mobiles), tablet computers or any other type of mobile communication device.

RF signals (e.g. transmit signals) generated via the RRHs are emitted though antenna 46 and an RF signals provided by handsets 48 are received through antenna 46 and coupled or otherwise provided to one or more RRHs 44. In embodiments, antenna 46 is provided having a substantially omni-directional antenna pattern. In embodiments, antenna 46 may be provided as a multiple-input, multiple-output (MIMO) antenna. In embodiments, antenna 46 may be provided as a MIMO antenna having a substantially omni-directional antennas pattern. In embodiments, antenna 46 may be integrated with RRH 14. The baseband unit and RRHs are operable with GSM, CDMA, UMTS, LTE, 4G, 5G, 6G technologies.

As noted above, based upon a measured signal-to-noise (SNR) on any given link in a cell (e.g. one of links 50a-50m in the cell of FIG. 3), the upper limit of channel capacity is known and based upon a selected coding strategy implemented in the link and the measured SNR, the maximum realizable channel capacity may be determined. Furthermore, an actual achieved bit rate in each link is known.

From these data, it can be determined how much "excess" SNR exists (with "excess" SNR being that amount of SNR which is above the amount to needed to continue communication at the actual achieved bit rate in a link). In response to the known actual bit rate achieved in links of a cellular network, the cellular network may be configured (or scaled) such that a transmitted output power of an RRH is set to an amount of transmitted output power which is substantially at or near a minimum amount of transmit power needed to maintain an achieved (or desired) bit rate.

In this way, the power consumption of an RRH may be reduced (or ideally minimized). Thus, the base station (e.g. baseband unit or RRH) may comprise or be coupled to a controller (e.g. such as one or both of processors 34, 36) capable of receiving data provided thereto and in response thereto determining a transmitted output power required of an RRH within a cellular network such that the RRH provides an amount of transmitted output power which is substantially at or near a minimum amount of transmit power needed at all times to maintain an achieved (or desired) bit rate.

In embodiments, an RRH which transmits signals at an output power which is substantially at or near a minimum amount of power needed to maintain a known or desired bit rate, power consumption of an RRH can be reduced below the power consumption used in a conventional RRH. Furthermore, by transmitting an output power which is at or near a minimum amount of transmit power needed to always maintain the known actual bit rate (and ideally which is always or nearly always at or near a minimum amount of transmit power needed to always maintain the known actual bit rate), the power consumption of an RRH may be minimized.

In embodiments, the RF lineup (and in particular RF Pas in a transmit signal path of an RRH), can be dynamically scaled to keep the efficiency high.

It has been recognized herein that by observing long-term statistics (e.g. SNR, bit rate, and/or achieved capacity), it is possible to design a remote radio head (RRH) and/or active antennas having a form factor which is smaller than the form factor of a conventional RRH and/or active antennas. This is possible since, in accordance with the concepts described herein, the RRH may be designed to satisfy needs derived from observing long-term statistics, rather than designed according to worst case scenarios. Such a design approach leads to smaller (in area and/or volume), lighter and/or more reliable RRHs.

In embodiments, one feedback mechanism utilizes real-time measurements of SNR, bit rate, and/or achieved capacity. Designing networks, systems and components (e.g., RRHs, power amplifiers, baseband units and other components) in accordance with the concepts described herein leads to an adaptable cellular network and ideally leads to a maximally adaptable cellular network which is highly efficient compared with existing conventional networks, systems and components. In embodiments, one feedback mechanism is feedback based upon long-term network statistics. In embodiments, multiple feedback mechanisms can be used. For example, in embodiments, real-time measurements of SNR and/or bit rate and/or achieved capacity and/or long-term network statistics can be used. In embodiments, the some or all of the above feedback mechanisms can be used alone or can be used in combination.

Figure 4A:
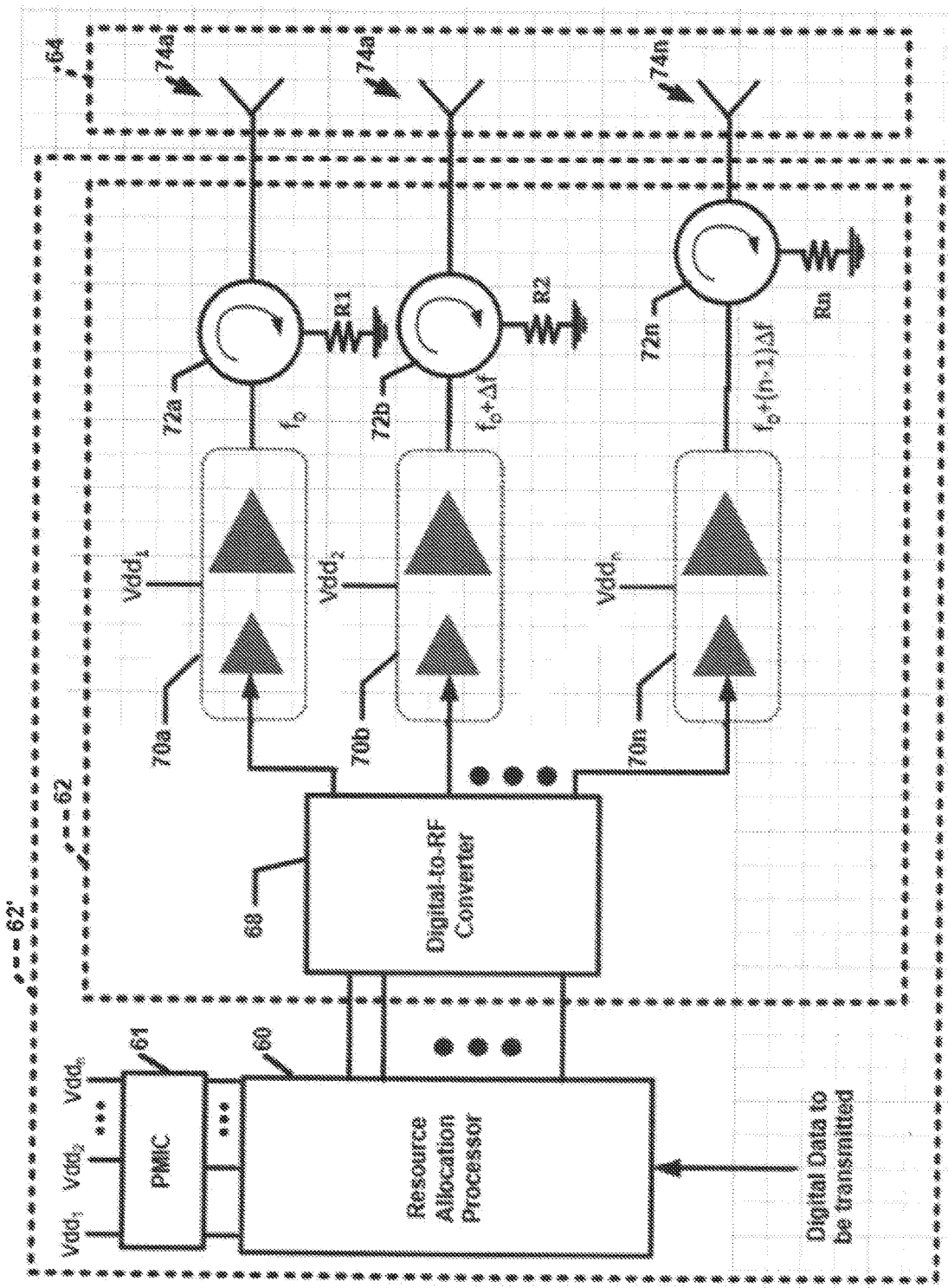
FIG. 4A is a block diagram of an architecture of an RRH comprising power amplifier (PA) lineups for a multiple-input, multiple-output (MIMO) active antenna.

Referring now to FIG. 4A, a system (which may be an RRH or an antenna integrated RRH) includes a resource allocation processor 60 which receives all digital data to be transmitted, allocates the data to spectral ranges and provides signals (e.g. IQ signals) to a digital-to-RF converter 68. In some embodiments the resource allocation processor may be provided as part of an RRH and in some embodiments the resource allocation processor may be provided as part of a baseband unit. Thus, in some embodiments, an RRH may comprise the elements identified by reference numeral 62. In other embodiments, an RRH may comprise the elements identified by reference numeral 62'. In still other embodiments, the RRH may comprise all elements shown in FIG. 4A (i.e., an integrated antenna/RRH).

The resource allocation processor also receives and processes data (e.g. long-term signal statistics) provided thereto to determine the manner in which to allocate data to spectral ranges. For example, a customer doing a voice call will be allocated relatively little spectrum, while a customer using a video application will need relatively more spectrum.

A power management circuit (PMC) 61, is coupled to receive signals from the resource allocation processor. In embodiments, the PMC may, for example, be provided as a power management integrated circuit (PMIC). The PMC may receive signals (e.g. control signals) and/or information from the resource allocation processor. In response to such signals and/or information, the PMC may determine and/or provide amplifier supply voltages (e.g. Vdds) to a supply terminal (or more generally a bias terminal) of respective ones of one or more power amplifiers 70a-70N. In providing information or signals (e.g. control signals) to the PMC, the resource allocation processor may utilize determined long-term signal statistics. In embodiments, such long-term signal statistics may be provided, for example, from a central network control (such as shown in FIGS. 2A, 2B).

In accordance with determined signal frequencies from the resource allocation processor, the digital-to-RF converter provides appropriate RF signals to ones of a plurality of RF amplifier transmit paths (with n paths 70a-70n being shown in the example of FIG. 4A).

The system is configured to enable the resource allocation processor to divide a communication channel so that no single RF power amplifier in an RRH has to carry so much bandwidth that it cannot be efficiently operated. The maximum efficient bandwidth for the communication channel is actually determined by the design of the RF hardware. That is, for a sub-6 GHz PA, it is generally agreed that 200 MHz of bandwidth will result in low efficiency operation, while 60 MHz of bandwidth can be handled with modern devices with high efficiency. This hardware constraint determines how one divides up the communications channel. The PAs may be biased in a way that the PA efficiency is relatively high compared with a maximum efficiency achievable with the PA. For example, a user having a voice call will be allocated relatively little spectrum, while a user utilizing a video application will need relatively more spectrum.

In embodiments, the resource allocation processor puts certain bits on PA1, PA2, etc. in accordance with the frequency slices they have been allocated.

Each power amplifier (PA) path 70a-70n may be tuned for operation at different center frequencies (e.g. frequencies at $f_0$, $f_0+\Delta f$, ... $f_0+(n-1)\Delta f$) to allow for coverage of wide aggregate bandwidths in a variety of deployed bands (channel capacity varies substantially linearly with bandwidth). In embodiments, the bandwidth of each path is chosen to allow high efficiency. When few bands are deployed, there is the option to raise amplifier supply voltages (e.g. Vdds) to keep total output power high. When many bands are deployed, PA bias voltages (e.g. PA supply voltages or Vdds) can be adjusted (e.g. lowered) to keep total output power constant. In embodiments, MIMO rank may be increased by adding more paths at a given frequency offset.

The output of the RF amplifier paths (each of which may comprise one or more amplifying devices) are coupled through a circulator 72a-72n or other protection device such as a transmit-receive (T/R) switch) to an RF port of an antenna 64. The protection device protects RF amplifiers in the amplifier path from high power RF signals received by the antenna or reflected from one or more antenna ports. In this embodiment, antenna 64 is provided as a MIMO antenna comprising antenna elements 74a-74n.

By dividing a communication channel so that no single RF power amplifier in an RRH has to carry so much bandwidth that it cannot be efficiently operated and by tuning each power amplifier (PA) path for different center frequencies, to allow for coverage of wide aggregate frequency bandwidths in a variety of deployed frequency bands, it is possible to provide RRHs having a frequency bandwidth and a capacity which is higher than conventional RRHs.

An additional benefit from using this approach is that RRHs provided in accordance with the concepts and techniques described herein are smaller and lighter than conventional RRHs (at least in part since heats sinks can be made smaller and thus lighted than heat sinks in conventional RRHs).

Some feedback mechanisms which can be used in accordance with the concepts, systems and techniques described herein include, but are not limited to: (1) real-time measurements of achieved bit rate, and effective MIMO rank; and long-term network statistics.

It should be noted that use of effective MIMO rank may lead to a maximally adaptable cellular network.

In embodiments, either or even multiple types of feedback may be used (either individually or in combination).

Some benefits of these concepts, systems and techniques include, but are not limited to an increase in the overall efficiency and lower the energy consumption of the RRH over its lifetime. The results in lower operating costs.

Some feedback mechanisms which can be used in accordance with the concepts, systems and techniques described herein include, but are not limited to: (1) real-time measurements of SNR, and/or monitoring the dynamic coding decisions made in the network that determine the PAPR for each RRH pipe; and/or long-term network statistics. Either feedback mechanism may be used individually, or these feedback mechanisms may be used in combination.

Each power amplifier (PA) path 70a-70n may be tuned for different center frequencies, to allow for coverage of wide aggregate bandwidths in a variety of deployed bands (channel capacity always goes linearly with bandwidth). In embodiments, the bandwidth of each path is chosen to allow the PAs to operate with high efficiency. When few bands are deployed, there is the option to raise amplifier supply voltages (e.g. Vdds) to keep total output power high. When many bands are deployed, PA bias voltages (e.g. PA supply voltages or Vdds) can be adjusted (e.g. lowered) to keep total output power constant. In embodiments, MIMO rank may be increased by adding more paths at a given frequency offset.

The concepts, systems and techniques described herein allow for high bandwidth, high capacity RRHs that are also small and light.

Some feedback mechanisms which can be used in accordance with the concepts, systems and techniques described herein include, but are not limited to: (1) real-time measurements of achieved bit rate, and effective MIMO rank (this leads to a maximally adaptable cellular network); and long-term network statistics. In embodiments, either or even multiple types of feedback may be used (either individually or in combination).

Some benefits of these concepts, systems and techniques include, but are not limited to an increase in the overall efficiency and lower the energy consumption of the RRH over its lifetime. The results in lower operating costs.

Some feedback mechanisms which can be used in accordance with the concepts, systems and techniques described herein include, but are not limited to: (1) real-time measurements of SNR, and/or monitoring the dynamic coding decisions made in the network that determine the PAPR for each RRH pipe; and/or long-term network statistics. Either feedback mechanism may be used or these feedback mechanisms may be used in combination.

It should be noted that in embodiments, the antenna system may be provided as part of the RRH.

Figure 4B:
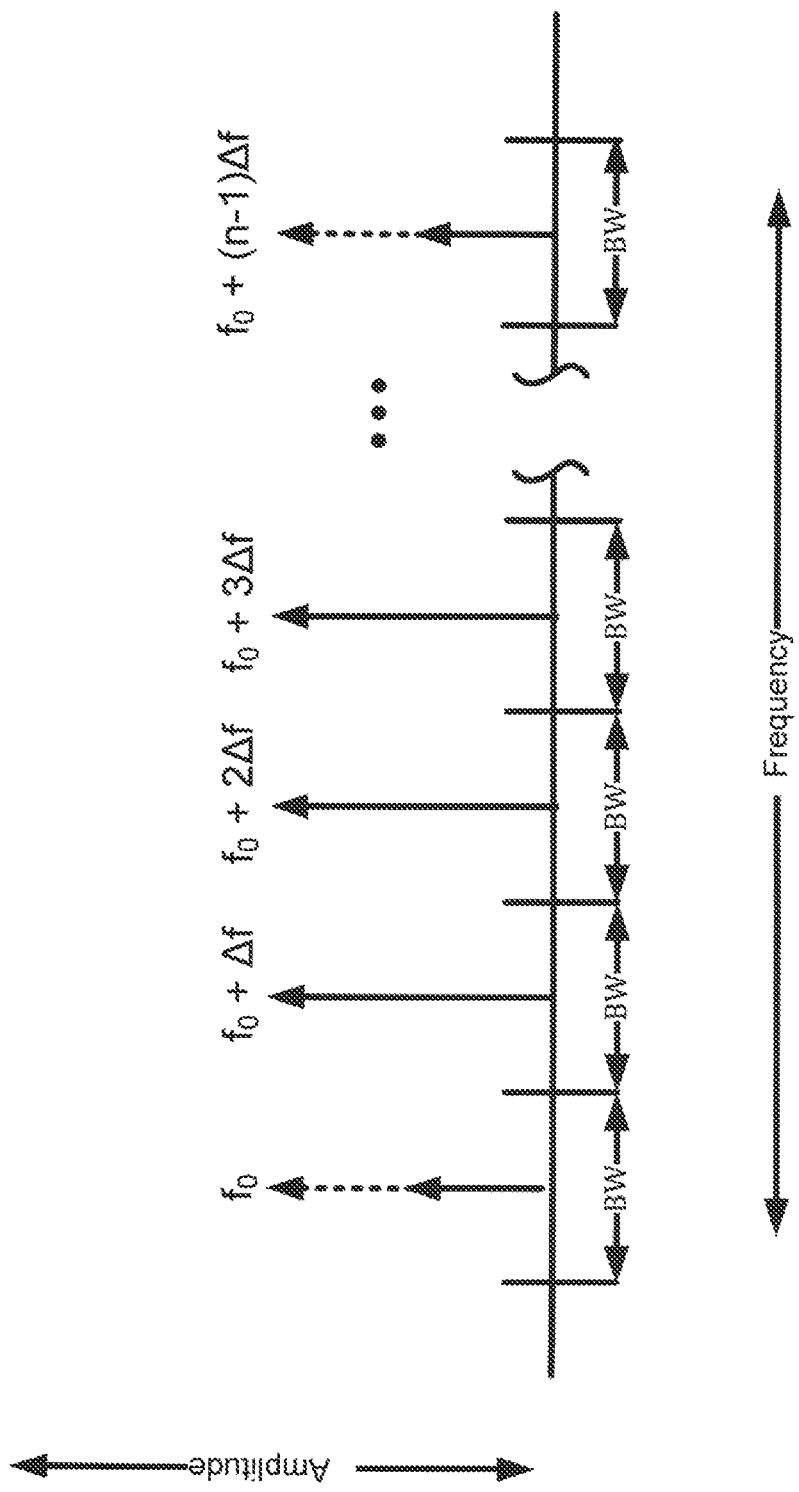
FIG. 4B is a plot of a frequency spectrum illustrating one example of vs. amplitude block diagram of an architecture of an RRH comprising power.

Referring now to FIG. 4B, a frequency spectrum illustrates PA frequency bands tuned for different center frequencies, to allow for coverage of wide aggregate bandwidths in a variety of deployed bands. In embodiments, the bandwidth of each allocated frequency band is chosen to allow high efficiency for a corresponding PA (i.e. for a PA operating in that particular frequency band). When few bands are deployed, there is the option to raise amplifier supply voltages (e.g. Vdds) to keep total output power high (i.e. the output power in each frequency band need not be the same). On the other hand, when many bands are deployed, PA bias voltages (e.g. PA supply voltages or Vdds) may be adjusted (e.g. lowered) to keep total output power constant.

Figure 4C:
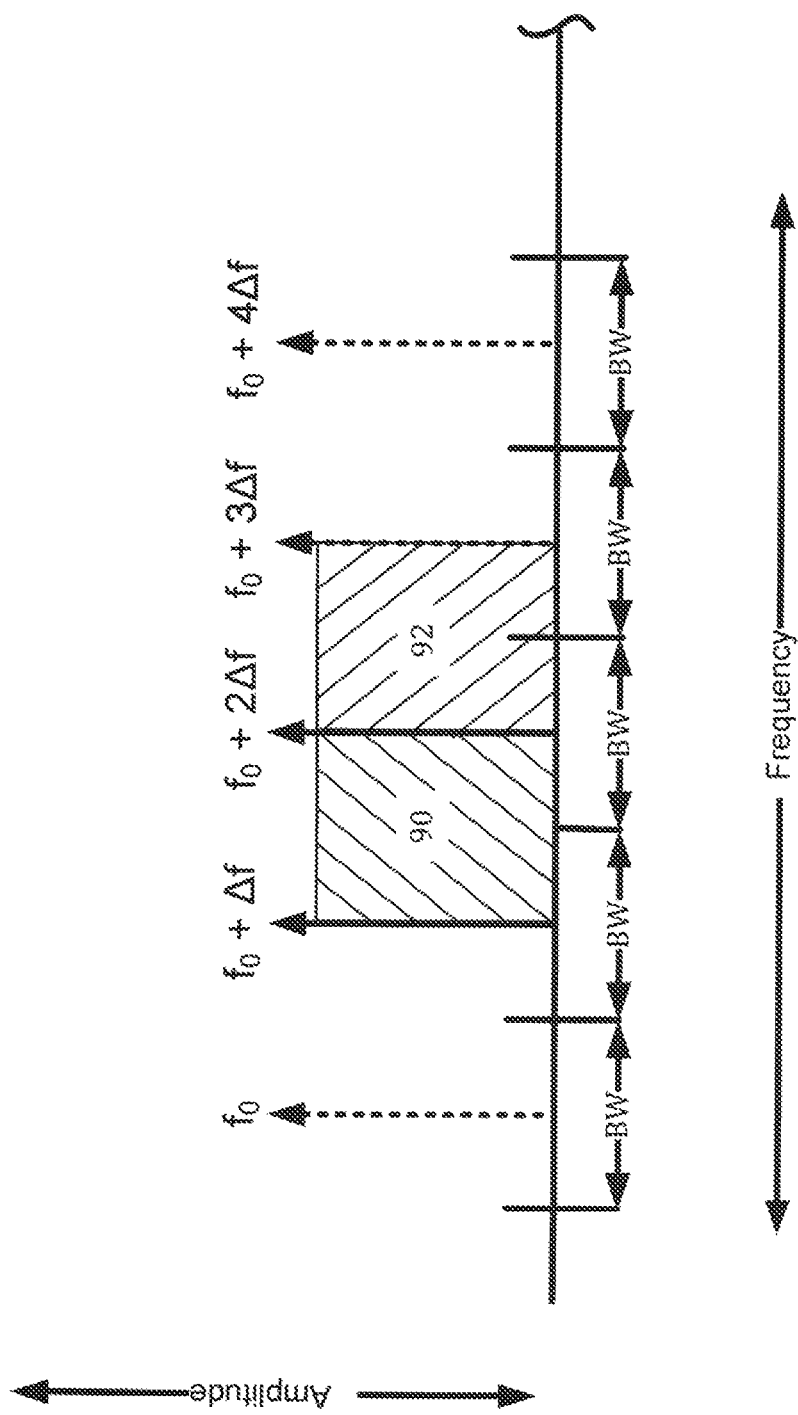
FIG. 4C is a plot of a frequency spectrum illustrating one example of vs. amplitude block diagram of an architecture of an RRH comprising power.

Referring now to FIG. 4C, an frequency spectrum illustrates example PA frequency bands tuned for different center frequencies. In this example each PA operates over a frequency bandwidth (BW) of 60 MHz. For a PA amplifier operating at a sub-6 GHz frequency band, 60 MHz of bandwidth can be handled with modern PAs with high efficiency. Thus, the bandwidth parameter determines, at least in part, how to divide the communications channel such that the PA may operate with an efficiency which is relatively high compared with a maximum efficiency achievable with the PA.

As illustrated in FIG. 4C, if all bits can be transmitted in 120 MHz of bandwidth, then only two PAs need be active (e.g. covering frequency ranges 90, 92 in FIG. 4C). This results in operation of an RRH provided in accordance with the concepts described herein which is more efficient than operation of a conventional RRH.

If more than 60 MHZ (or less) of BW is required to transmit all desired bits, then a single PAs may be used (e.g. a PA operating one of frequency bands 90, 92). If more than 120 MHZ of BW is required to transmit all desired bits, then PAs in additional frequency ranges (i.e. PAs in addition to PAs operating in frequency bands 90, 92) can be activated to increase the RRH bandwidth. This allows for coverage of variable and wide aggregate bandwidths in a variety of deployed bands while still maintaining efficient operation of the PAs and the RRH. When few bands are deployed (as illustrated in FIG. 4C), there is the option to raise amplifier supply voltages (e.g. Vdds) to keep total output power high (i.e. the output power in each frequency band need not be the same). On the other hand, when many bands are deployed, PA bias voltages (e.g. PA supply voltages or Vdds) may be adjusted (e.g. lowered) to keep total output power constant.

Figure 5:
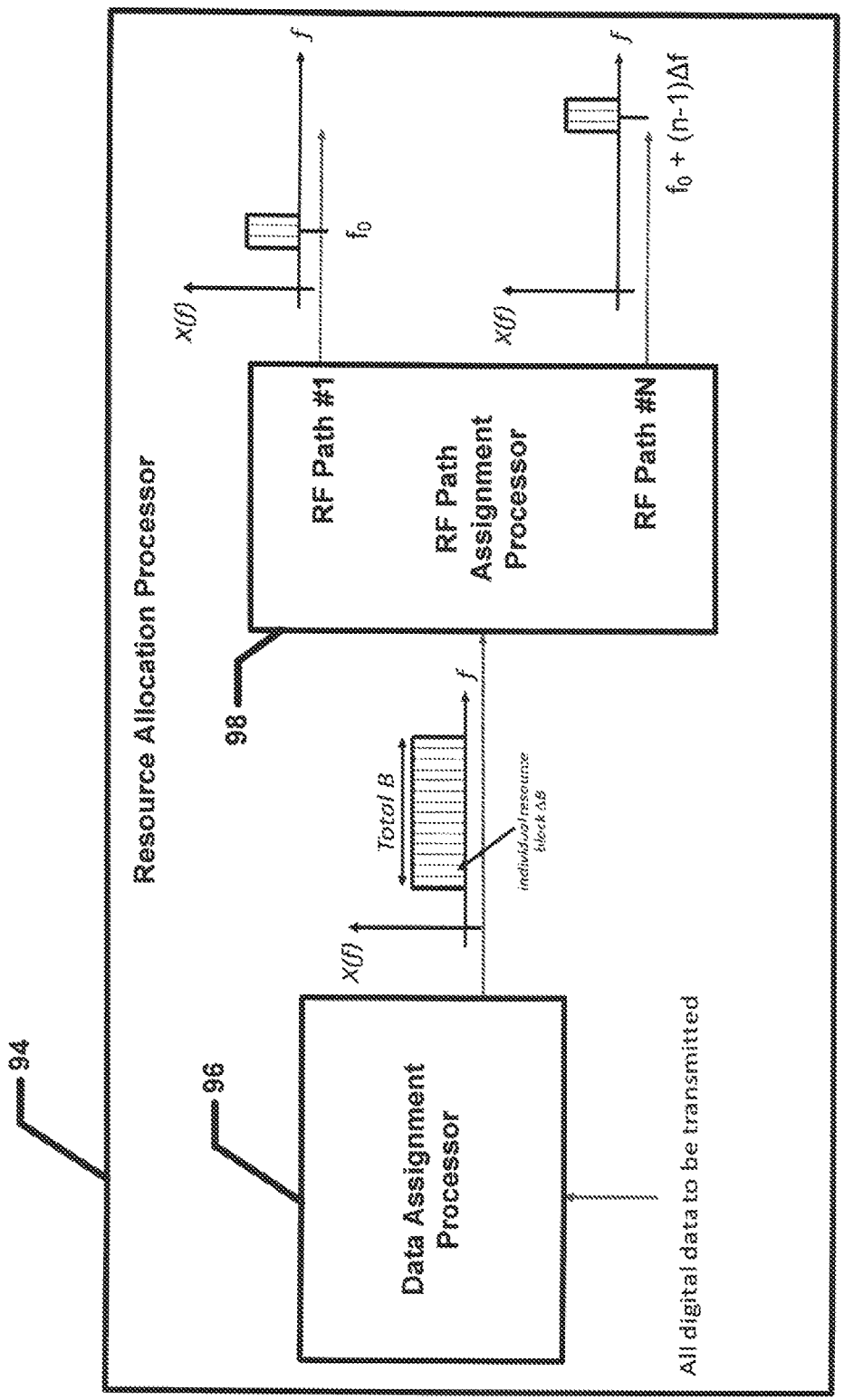
FIG. 5 is a block diagram of resource allocation processor.

Referring now to FIG. 5, a resource allocation processor 94 which may be the same as or similar to resource allocation processor 60 described above in conjunction with FIG. 4A, comprises a data assignment processor 96 configured to receive all digital data to be transmitted. As illustrated in FIG. 5, data assignment processor 96 assigns individual resource blocks ΔB from a total block B. The assignments are provided to an RF path assignment processor 98 which places the assigned blocks ΔB on appropriate ones of RF signals paths (e.g. RF paths 70a-70n in FIG. 4A which comprise PAs).

With this approach all digital data to be transmitted is provided to a plurality of a communication channels such that no single radio frequency (RF) power amplifier (PA) in a remote radio head (RRH) operates over an excessively wide frequency bandwidth. This allows efficient operation of RF PAs (e.g. (e.g. RF PAs in RF paths 70a-70n) wherein each PA transmit path is tuned for operation at a respective one of a plurality of different center frequencies ($f_0$, $f_0+\Delta f$, ... $f_0+(n-1)\Delta f$ where n is an integer corresponding to the number of RF PA transmit paths).

Although reference is made herein to particular systems or configurations, it is appreciated that other systems or configurations having similar functional and/or structural properties may be substituted where appropriate, and that a person having ordinary skill in the art would understand how to select such systems or configurations and incorporate them into embodiments which incorporate the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A remote radio head (RRH) comprising:
   a plurality of radio frequency (RF) amplifier transmit paths, each of the plurality of RF amplifier transmit paths including at least one RF power amplifier (PA) and wherein the plurality of RF transmit paths is tuned for operation at a respective one of a plurality of different center frequencies ($f_0$, $f_0+F$, ... $f_0+(n-1)\Delta f$) where $\Delta f$ is a frequency offset and n is an integer corresponding to the number of RF amplifier transmit paths; and
   a resource allocation processor configured to divide a communication channel into n frequency bands wherein the number of frequency bands and number of RF amplifier transmit paths is selected such that no single RF power amplifier in any of the plurality of amplifier transmit paths operates over a frequency bandwidth which prevents efficient operation of the RF amplifier.

2. The remote radio head of claim 1 wherein:
   in response to less than n frequency bands being utilized, RF PA supply voltages (Vdds) can be raised; and
   in response to n bands being deployed, RF PA supply voltages (Vdds) can be raised to keep an output power of the power amplifiers the same.

3. The remote radio head of claim 2 further comprising a power management circuit configured to provide PA supply voltages (Vdds) to RF power amplifiers in the RF amplifier transmit paths.

4. The remote radio head of claim 1 wherein each power amplifier (PA) in each of the respective RF amplifier transmit paths is tuned for operation at a different center frequency.

5. The remote radio head of claim 4 wherein each power amplifier in each of the respective RF amplifier transmit paths is tuned for operation at a different center frequency to provide for coverage of wide aggregate frequency bandwidths in a variety of deployed frequency bands.

6. The remote radio head of claim 1 wherein the bandwidth of each RF amplifier transmit path is selected to allow high efficiency operation of a PA in the RRH.

7. The remote radio head of claim 1 further comprising a feedback mechanism.

8. The remote radio head of claim 7 further comprising one or more of:
   (a) means for providing real-time measurements of achieved bit rate to the resource allocation processor;
   (b) means for providing effective MIMO rank to the resource allocation processor;
   (c) means for providing long-term network statistics to the resource allocation processor;
   (d) means for providing real-time measurements of signal-to-noise ratio (SNR) to the resource allocation processor;
   (e) means for monitoring dynamic coding decisions made in a cellular network that determine a peak-to-average power ratio (PAPR) for each antenna and associated RF amplifier transmit path and for providing such PAPR to the resource allocation processor; and
   (e) means for monitoring achieved capacity and for providing such achieved capacity statistics to the resource allocation processor.

9. The remote radio head of claim 1 wherein RF power amplifiers in the RF amplifier transmit signal path are configured to be dynamically scaled by adjusting a bias voltage level provided to the RF power amplifiers.

10. The remote radio head of claim 1 wherein RF power amplifiers in the RF amplifier transmit signal path are configured to be dynamically scaled by adjusting a supply voltage provided thereto.

11. An adaptable cellular network comprising:
    a remote radio head (RRH) having a plurality of transmit signal paths with each transmit signal path comprising one or more power amplifiers and with each transmit signal path tuned for operation at different center frequency ($f_0$, $f_0+\Delta f$, ... $f_0+(n-1)\Delta f$) where $\Delta f$ is a frequency offset and n is an integer representing the number of transmit signal paths in the RRH and wherein each transmit signal path has an operational frequency bandwidth selected such that each power amplifier in the respective transmit signal path operates with high efficiency.

12. The system of claim 11 wherein the RRH determines how many of the n transmit signal paths to use to transmit information depending upon an amount of information to be transmitted and in response to the number of transmit paths being utilized, bias voltages to the one or more power amplifiers in each transmit signal path are adjusted to keep total output power substantially constant.

13. The adaptable cellular network of claim 12 wherein:
    in response to less than n transmit signal paths being utilized by the RRH, bias voltages provided to power amplifiers in the utilized signal paths are raised; and
    in response to n transmit signal paths being utilized by the RRH, bias voltages provided to power amplifiers in the utilized signal paths are lowered.

14. The adaptable cellular network of claim 12 further comprising one or more of:
    a feedback mechanism for determining real-time measurements of SNR and for providing information corresponding to such real-time measurements of SNR to the RRH;
    a feedback mechanism for real-time measurements of bit rate and for providing information corresponding to such real-time measurements of bit rate to the RRH;
    a feedback mechanism for real-time measurements of achieved capacity and for providing information corresponding to such real-time measurements of achieved capacity to the RRH; and
    a feedback mechanism for long-term network statistics and for providing information corresponding to such long-term network statistics to the RRH.

* * * * *